US009170475B2

(12) United States Patent
Maes et al.

(10) Patent No.: US 9,170,475 B2
(45) Date of Patent: Oct. 27, 2015

(54) LIGHT VALVE PROJECTOR WITH LASER-PHOSPHOR LIGHT CONVERTER

(71) Applicant: Barco N.V., Kortrijk (BE)

(72) Inventors: Dirk L. A. Maes, Wevelgem (BE); Rik Defever, Kortrijk (BE); Bart Henri Johanna Maximus, Oudenaarde (BE)

(73) Assignee: Barco N.V., Kortrijk (BE)

( * ) Notice: Subject to any disclaimer, the term of this patent is extended or adjusted under 35 U.S.C. 154(b) by 205 days.

(21) Appl. No.: 13/778,199

(22) Filed: Feb. 27, 2013

(65) Prior Publication Data

US 2014/0240676 A1 Aug. 28, 2014

(51) Int. Cl.
*G03B 21/00* (2006.01)
*G03B 21/20* (2006.01)
*G02B 27/26* (2006.01)
*H04N 9/31* (2006.01)
*H01S 5/00* (2006.01)
*G02F 1/1335* (2006.01)
*G02F 1/1362* (2006.01)
*G03B 21/16* (2006.01)

(52) U.S. Cl.
CPC .............. *G03B 21/204* (2013.01); *G02B 27/26* (2013.01); *G03B 21/208* (2013.01); *G03B 21/2073* (2013.01); *H04N 9/3158* (2013.01); *G02B 2207/113* (2013.01); *G02F 1/133621* (2013.01); *G02F 2001/133614* (2013.01); *G02F 2001/136281* (2013.01); *G03B 21/16* (2013.01); *G03B 21/2013* (2013.01); *H01S 5/005* (2013.01)

(58) Field of Classification Search
CPC ... G03B 21/14; G03B 21/204; G03B 21/2013

USPC ........ 353/31, 84, 85, 94, 98, 99; 362/84, 231, 362/241
See application file for complete search history.

(56) References Cited

U.S. PATENT DOCUMENTS

| 7,554,258 | B2 | 6/2009 | Rossner | |
|---|---|---|---|---|
| 2011/0249242 | A1 | 10/2011 | Saitou | |
| 2011/0310363 | A1* | 12/2011 | Kita | 353/98 |
| 2012/0002172 | A1* | 1/2012 | Ikeda et al. | 353/20 |
| 2012/0081679 | A1* | 4/2012 | Matsumoto | 353/98 |
| 2012/0106126 | A1 | 5/2012 | Nojima | |
| 2012/0133903 | A1* | 5/2012 | Tanaka | 353/31 |

(Continued)

FOREIGN PATENT DOCUMENTS

| WO | 2006035388 | 4/2006 |
|---|---|---|
| WO | 2012127554 | 9/2012 |

*Primary Examiner* — Sultan Chowdhury
(74) *Attorney, Agent, or Firm* — Renner, Otto, Boisselle and Sklar, LLP (57) ABSTRACT

A method and system are presented directed to a light valve projector with a laser-phosphor light converter. The phosphor converter converts excitation light in order to provide light to a light valve projector. The phosphor converter reduces the étendue of laser-phosphor light sources using a light pipe integrator system. The light pipe integrator system includes a light pipe integrator configured to mix the excitation light and reduce the spot size of excitation light entering the system from, e.g., a laser array. The excitation light is imaged onto a phosphor as it exits the light pipe integrator. The phosphor emits fluorescent light, in response to being illuminated by the excitation light, that enters the light pipe integrator. The light pipe integrator reduces the emission angles of the fluorescent light while maintaining the étendue of the fluorescent light. The system and method may include a reflective polarizer to polarize the fluorescent light.

22 Claims, 8 Drawing Sheets

(56) References Cited

U.S. PATENT DOCUMENTS

| | | | |
|---|---|---|---|
| 2012/0188518 A1* | 7/2012 | Mukouyama et al. | 353/31 |
| 2012/0300178 A1* | 11/2012 | Sugiyama et al. | 353/31 |
| 2013/0070215 A1* | 3/2013 | Higo | 353/85 |
| 2013/0229787 A1* | 9/2013 | Berben et al. | 362/84 |

* cited by examiner

LIGHT VALVE PROJECTOR WITH LASER-PHOSPHOR LIGHT CONVERTER

TECHNICAL FIELD

The technology of the present disclosure relates generally to light valve projectors and in particular to a laser phosphor converter that may additionally have other applications.

BACKGROUND

Light sources outputting red, green, and blue (RGB) light are required in many applications (e.g., light valve projectors). For low brightness light valve projectors RGB light emitting diodes (LEDs) can be used. As the efficiency of green LEDs is currently inferior to red and blue LEDs, the green LED is typically the limiting factor in maximal achievable brightness. RGB Laser light sources can be used to build extremely high brightness light valve projectors. Blue and red laser diode arrays are available as sources for the blue and red light respectively. However, currently green laser diodes have low efficiency and low output power. Frequency doubled green lasers are available at high power, but are much more expensive then red and blue diode lasers.

In order to create cost effective, high brightness, RGB light sources, phosphor conversion technology has been used to convert lower wavelength excitation light like blue or near-UV laser light into higher wavelength light like green, yellow or red light. An RGB light source may be created, e.g., utilizing a red laser diode array, a blue laser diode array, and a phosphor that emits green light when illuminated with blue light (i.e., from the blue laser diode array). The use of green phosphors in RGB light sources may, however, limit the utility of the light source.

When illuminated with an excitation light source, phosphors emit fluorescent light in nearly every direction, significantly growing the étendue of a light source and making it difficult to collect a majority of the emitted light from the phosphor. Using a lens systems to collect a majority of the emitted light will further grow the étendue of the light source. In order to function with the highest possible effectiveness as a light source, the étendue of the light source needs to be smaller than the étendue of the projector. In order to meet this requirement and reduce the étendue, the excitation light source may be limited to illuminating a smaller area (spot size) of the phosphor. However, problematically, the smaller the illuminated spot size, the higher the energy density and the more difficult it becomes to cool the phosphor and maintain the highest conversion efficiency on the phosphor.

In addition to étendue concerns, the use of phosphors in RGB light sources introduces other limitations. For example, light from an excitation light needs to be evenly distributed across a phosphor to avoid the creation of hotspots in the phosphor where locally, due to thermal quenching, the efficiency is significantly reduced. Additionally, light emitted from a phosphor is not polarized and, thus, phosphors cannot be used in applications requiring polarized light.

SUMMARY

A system and apparatus is proposed to reduce the étendue of laser-phosphor light sources using a light pipe integrator system.

According to one aspect of the disclosure, a light valve projector includes a light valve device, a source of polarized excitation light and a phosphor converter that receives the excitation light. The phosphor converter includes a phosphor material located on the surface of a reflector and a light pipe integrator system. The phosphor material, when irradiated by the excitation light, emits fluorescent light having a different spectrum than a spectrum of the excitation light. The light pipe integrator system includes a light pipe integrator. The light pipe integrator has a first surface through which the excitation light enters the light pipe integrator and a second surface through which the excitation light exits the light pipe integrator. The light pipe integrator system is positioned relative to the source and the phosphor material such that, when the source outputs excitation light, the first surface of the light pipe integrator receives the excitation light. The light pipe integrator system is also positioned relative to the source and the phosphor material such that, when excitation light exits the second surface of the light pipe integrator, the excitation light is imaged onto the phosphor material. The light pipe system is positioned such that, when the phosphor material emits fluorescent light, the second surface of the light pipe integrator is positioned to receive a majority of the fluorescent light and the fluorescent light is transmitted to the first surface of the light pipe integrator.

According to another aspect of the disclosure, a phosphor converter receives excitation light emitted by a source of polarized excitation light. The phosphor converter includes a phosphor material located on the surface of a reflector and a light pipe integrator system. The phosphor material, when irradiated by the excitation light, emits fluorescent light having a different spectrum than a spectrum of the excitation light. The light pipe integrator system includes a light pipe integrator. The light pipe integrator has a first surface through which the excitation light enters the light pipe integrator and a second surface through which the excitation light exits the light pipe integrator. The light pipe integrator system is positioned relative to the source and the phosphor material such that, when the source outputs excitation light, the first surface of the light pipe integrator receives the excitation light. The light pipe integrator system is also positioned relative to the source and the phosphor material such that, when excitation light exits the second surface of the light pipe integrator, the excitation light is imaged onto the phosphor material. The light pipe system is positioned such that, when the phosphor material emits fluorescent light, the second surface of the light pipe integrator is positioned to receive a majority of the fluorescent light and the fluorescent light is transmitted to the first surface of the light pipe integrator.

Additionally, the light pipe system may include a mild diffuser positioned such that the excitation light is diffused by the diffuser prior to being received by the phosphor converter.

Additionally, the light pipe integrator system may include a tapered light pipe integrator.

Additionally, the light pipe integrator system may include an exit lens. The exit lens may be positioned adjacent the first surface of the tapered light pipe integrator, and the exit lens may be configured to transform light bundles exiting the first surface of the tapered light pipe integrator to be telecentric.

Additionally, the light pipe integrator system may include a lens system. The lens system may be positioned between the light pipe integrator and the phosphor material. The lens system may include lenses configured to create an image of the illuminated part of the phosphor material onto the second surface of the light pipe integrator.

Additionally, the lens system may include a spherical reflector. The spherical reflector may be positioned relative to the phosphor material such that, when the phosphor material emits fluorescent light, the spherical reflector captures a part of the fluorescent light emitted by the phosphor material in a direction that is not captured by the lenses of the lens system and/or a part of the excitation light which is not absorbed but diffusively reflected by the phosphor, and reflects that light back to the phosphor material. The phosphor material may be configured to scatter fluorescent light reflected by the spherical reflector such that the light is added to the emitted fluorescent light in random directions, and/or to absorb part of the excitation light reflected back by the spherical reflector and emit an additional amount of fluorescent light in random directions.

Additionally, a reflective polarizer may be positioned in the light path between the polarized excitation light source and the phosphor material. The reflective polarizer transmits light exhibiting a same polarization as the excitation light and reflects light exhibiting an orthogonal polarization as the excitation light. The fluorescent light may exhibit a mix of the same polarization as the excitation light and the orthogonal polarization as the excitation light. The phosphor material may be configured to scatter fluorescent light reflected by the reflective polarizer such that the polarization exhibited by the scattered fluorescent light exhibits both the same polarization as the excitation light and the orthogonal polarization as the excitation light.

Additionally, the reflective polarizer may be located in close proximity to the phosphor material.

Additionally, the second surface of the light pipe integrator may be positioned in close proximity to the phosphor material and the reflective polarizer may be positioned in close proximity to first surface of the light pipe integrator.

Additionally, the light source may include a heat sink and the phosphor material may be thermally coupled to the heat sink.

Additionally, the heat sink may include a liquid heat exchanger.

Additionally, the source may include a laser diode or an array of laser diodes.

Additionally, the first surface of the light pipe integrator may include a transmissive portion and a reflective portion for a defined range of wavelengths, including the wavelengths of the incident excitation light. A dichroic element may cover the reflective portion of the first surface. The dichroic element may be configured to reflect light having a spectrum in the spectrum of the excitation light and pass light having a spectrum in the spectrum of the fluorescent light emitted by the phosphor material. The transmissive portion of the first surface may be configured to allow the excitation light to enter the light pipe integrator.

Additionally, a red shifting dichroic element may be positioned in the light path between the polarized excitation light source and the phosphor material. The red shifting dichroic element may be configured to reflect the fluorescent light having a wavelength range in a lower part of the spectrum of the fluorescent light.

Additionally, the spectrum of the excitation light may be between 400 nm and 495 nm and the spectrum of the fluorescent light may be between 495 nm and 700 nm.

Additionally, the phosphor material may be a layer having a thickness of approximately 50 micrometers.

Additionally, the length of the light pipe integrator may be at least 50 mm.

Additionally, a dichroic polarizing beam splitter may be positioned such that, when the source emits excitation light, the excitation light is reflected by the dichroic polarizing beam splitter such that the excitation light enters the first surface of the light pipe integrator system. The dichroic polarizing beam splitter may be configured to reflect light having a spectrum of the excitation light and exhibiting one polarity, transmit light having the spectrum of the excitation light and exhibiting an orthogonal polarity, and transmit light having a spectrum in the spectrum of the fluorescent light emitted by the phosphor material.

Additionally, the light source may include a quarter wave retarder to rotate the polarization direction of the excitation light when the excitation light is reflected at the position of the phosphor material.

Additionally, a dichroic polarizing beam splitter may be positioned such that, when the source emits excitation light, the excitation light is transmitted by the dichroic polarizing beam splitter such that the excitation light enters the first surface of the light pipe integrator system. The dichroic polarizing beam splitter may be configured to transmit light having a spectrum of the excitation light and exhibiting one polarity, reflect light having the spectrum of the excitation light and exhibiting an orthogonal polarity, and reflect light having a spectrum in the spectrum of the fluorescent light emitted by the phosphor material.

According to another aspect of the disclosure, a light source includes a source of polarized excitation light and a phosphor converter receiving the excitation light. The phosphor converter includes a phosphor material located on the surface of a reflector. The phosphor material, when irradiated by the excitation light, emits fluorescent light having a different spectrum than a spectrum of the excitation light. A reflective polarizer is positioned in the light path between the polarized excitation light source and the phosphor material. The reflective polarizer transmits light exhibiting a same polarization as the excitation light and reflects light exhibiting an orthogonal polarization as the excitation light. The fluorescent light exhibits a mix of the same polarization as the excitation light and the orthogonal polarization as the excitation light. The phosphor material is configured to scatter fluorescent light reflected by the reflective polarizer such that the polarization exhibited by the scattered fluorescent light exhibits both the same polarization as the excitation light and the orthogonal polarization as the excitation light.

According to another aspect of the disclosure, a method is disclosed for phosphor conversion of received polarized excitation light using a phosphor material and a light pipe integrator system. The light pipe integrator system includes a light pipe integrator. The method includes directing the excitation light into the light pipe integrator system. The excitation light enters a first surface of the light pipe integrator and propagates by total internal reflection from the first surface of the light pipe integrator to a second surface of the light pipe integrator. The excitation light exits the second surface of the light pipe integrator and the light pipe integrator system images the excitation light onto the phosphor material. The method also includes irradiating the phosphor material with the excitation light exiting the light pipe integrator system such that the phosphor material emits fluorescent light having a different spectrum than a spectrum of the excitation light. The method additionally includes directing the fluorescent light emitted by the phosphor material to enter the light pipe integrator system such that the fluorescent light enters the second surface of the light pipe integrator. The method also includes directing the fluorescent light to pass through the light pipe integrator and exit the light pipe integrator via the first surface.

According to another aspect of the disclosure, a method is disclosed for outputting polarized fluorescent light using phosphor conversion of received polarized excitation light using a phosphor material and a reflective polarizer. The phosphor material is located on a surface of a reflector and the reflective polarizer transmits light exhibiting a same polarization as the excitation light and reflects light exhibiting an orthogonal polarization as the excitation light. The method includes directing the excitation light to pass through the reflective polarizer prior to irradiating the phosphor material and irradiating the phosphor material with the excitation light passing through the reflective polarizer such that the irradiated phosphor material emits fluorescent light having a different spectrum than a spectrum of the excitation light. The fluorescent light emitted by the phosphor material exhibits both the same polarization as the excitation light and the orthogonal polarization as the excitation light. The method also includes passing the fluorescent light exhibiting the same polarization as the excitation light through the reflective polarizer and reflecting towards the phosphor material, by the reflective polarizer, the fluorescent light exhibiting the opposite polarization as the excitation light. The method also includes altering, due to scattering caused by the phosphor material, the polarization exhibited by the fluorescent light reflected by the reflective polarizer, such that the fluorescent light scattered by the phosphor material exhibits both the same polarization as the excitation light and the opposite polarization as the excitation light. The method also includes altering, due to scattering caused by the phosphor material, the polarization exhibited by the fluorescent light reflected by the reflective polarizer, such that after multiple cycles of reflection by the polarizer and scattering by the phosphor material, the majority of the fluorescent light exits the reflective polarizer with the same polarization as the excitation light.

The features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope.

Features that are described and/or illustrated with respect to one embodiment may be used in the same way or in a similar way in one or more other embodiments and/or in combination with or instead of the features of the other embodiments.

DETAILED DESCRIPTION

The present invention provides a method and system to reduce the étendue of laser-phosphor light sources using a light pipe integrator system. The light pipe integrator system includes a light pipe integrator and is configured to mix the excitation light and reduce the spot size of excitation light entering the system from, e.g., a laser array. The excitation light is imaged onto a phosphor as it exits the light pipe integrator. The phosphor emits fluorescent light, in response to being illuminated by the excitation light, that enters the light pipe integrator. The light pipe integrator reduces the emission angles of the fluorescent light while maintaining the étendue of the fluorescent light.

Figure 1:
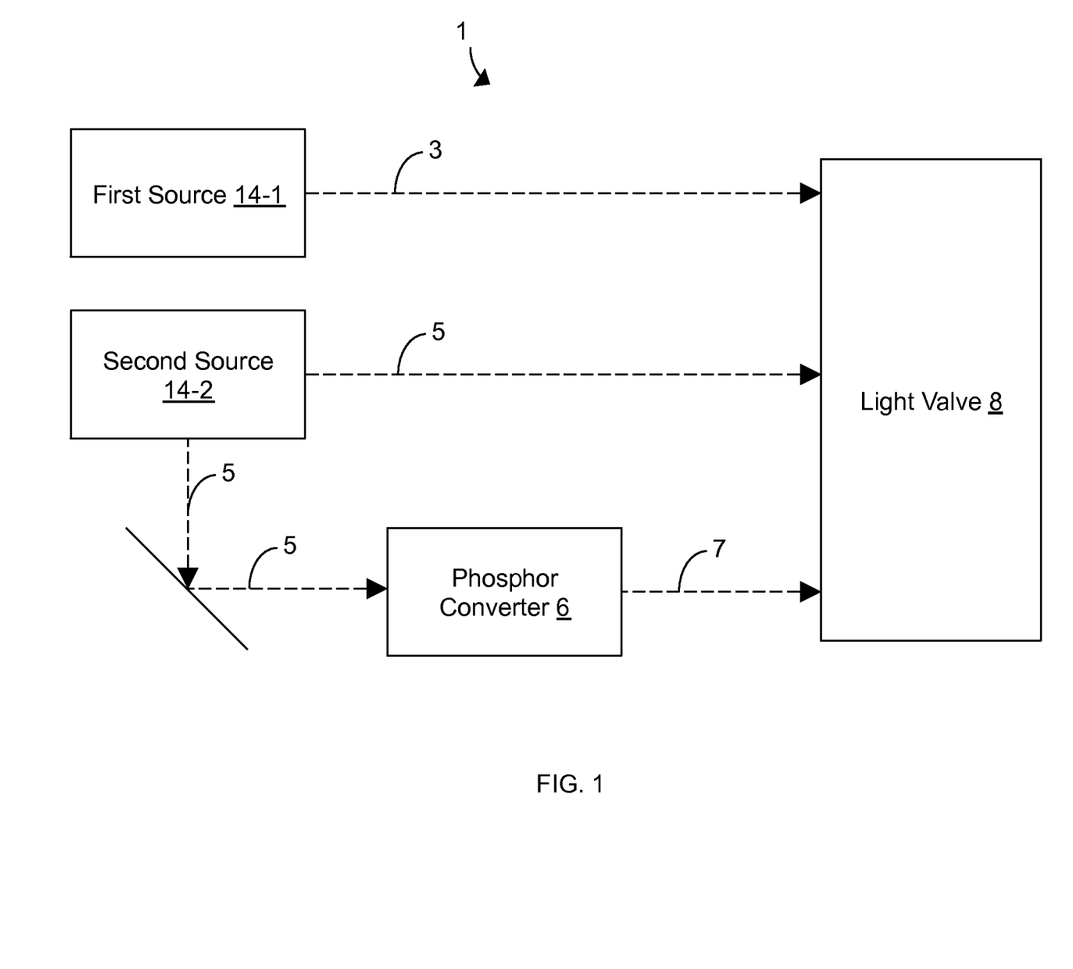
FIG. 1 is a schematic view of an exemplary light valve projector.

An exemplary digital light projector 1 is illustrated in FIG. 1. The digital light projector 1 comprises a phosphor converter 6, a light valve device 8, and at least one light source 14-1, 14-2. The digital light projector 1 may include a first source 14-1 emitting red light 3 and a second source 14-2 emitting blue polarized excitation light 5. The phosphor converter 6 may receive a portion of the blue polarized excitation light 5. The phosphor converter 6 may convert the received blue polarized excitation light 5 to green light 7. The light valve device 8 may receive the red light 3, blue polarized excitation light 5, and green light 7. The light valve device 8 may operate on the received red light 3, blue excitation light 5, and green light 7, before outputting the light.

The light valve device 8 may comprise one or more DLP chips, digital micromirror devices, LCD devices, Liquid Crystal On Silicon (LCOS) devices, optical semiconductor chips, deformable mirror devices, or any other suitable device for creating an image from an RGB light source.

Figure 2:
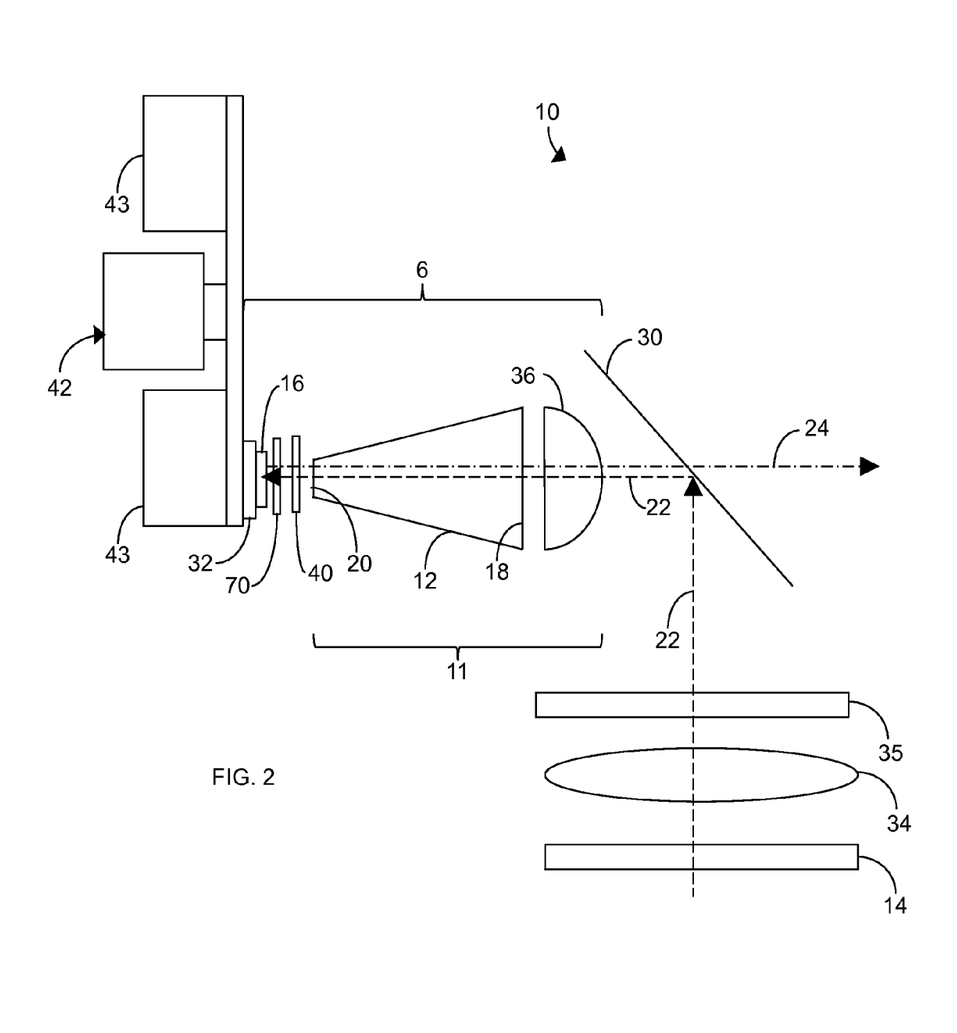
FIG. 2 is a schematic view of an exemplary laser-phosphor light source.

Turning to FIG. 2, a laser-phosphor light source system 10 includes a phosphor converter 6 and a source 14 of polarized excitation light 22 (e.g., a laser array 14). The phosphor converter 6 includes a light pipe integrator system 11 and a phosphor material 16. The light pipe integrator system 11 includes a light pipe integrator 12. The light pipe integrator 12 is positioned to receive the excitation light 22 and image the excitation light 22 onto the phosphor material 16. The phosphor material 16 emits fluorescent light 24 when irradiated by the excitation light 22, a majority of which may be received by the light pipe integrator 12.

The source 14 may be a laser diode, an array of laser diodes, a light emitting diode (LED) in combination with a polarizer, or any other suitable source of polarized light. The source 14 may output polarized excitation light 22 having any suitable spectrum. For example, the source 14 may be a blue laser array, the polarized excitation light 22 having a spectrum between 400 nm and 495 nm.

The polarized excitation light 22 may be received by the light pipe integrator 12 of the light pipe integrator system 11. The light pipe integrator 12 may be positioned relative to the source 14 such that, when the source 14 outputs excitation light 22, a first surface 18 of the light pipe integrator receives the excitation light 22. The polarization of the polarized excitation light 22 may be aligned with the orientation of a pair of sidewalls of the light pipe integrator 12, such that polarization of the polarized excitation light 22 is maintained in the light pipe integrator 12.

The light pipe integrator 12 may be a tapered light pipe integrator (FIG. 2), a straight light pipe integrator (FIG. 3), or any other suitably shaped light pipe integrator. The light pipe integrator 12 may also be solid or hollow. Light may propagate in both the hollow and the solid light pipe integrator 12 through multiple reflections. As light propagates in the light pipe integrator 12, the light mixes, uniformizing the incoming light and removing speckle. Mixing of the polarized excitation light 24 in the light pipe integrator 12 may avoid hot spots in the phosphor material 16, due to removal of high intensity areas of the polarized excitation light 22. A length of the light pipe integrator 12 may be chosen to allow for sufficient mixing of the input light, e.g., the length of the light pipe integrator may be at least 50 millimeters. The light pipe integrator may be made of fused silica and both the first surface 18 and a second surface 20 may be covered with an anti-reflective coating.

With further reference to FIG. 2, the system 10 is depicted including a tapered light pipe integrator 12. For example, the tapered light pipe integrator 12 may be a solid tapered light pipe integrator 12 with a wiregrid reflective polarizer 70 deposited onto the first surface 18. As the incoming polarized excitation light 22 propagates through the tapered light pipe integrator 12, the spotsize of the polarized excitation light 22 reduces while the angles of the polarized excitation light 22 increase.

As depicted in FIG. 2, the light pipe integrator 12 is positioned relative to the phosphor material 16 such that, when the polarized excitation light 22 exits the second surface 20 of the light pipe integrator 12, the excitation light 22 is imaged onto the phosphor material 16. The light pipe integrator 12 may be positioned relative to the phosphor material 16 such that a gap between the second surface 20 and the phosphor material 16 may be as small as possible, while large enough to avoid frustrated total internal reflection (e.g., 10 micrometers).

The phosphor material 16, when irradiated by the polarized excitation light 22, emits fluorescent light 24 having a different spectrum than a spectrum of the polarized excitation light 22. The fluorescent light 24 may have any suitable spectrum, e.g., green fluorescent light between 495 nm and 700 nm. In many of the described exemplary embodiments, phosphor conversion of blue laser light to green fluorescent light is described. However, the same principles may be applied using, e.g., a rotating color wheel containing different segments covered with different phosphor materials to produce red, green, yellow and infrared and/or cyan light. The rotating color wheel may contain a reflective segment to enable outputting blue laser light.

The phosphor material 16 may be deposited in a highly thermally conductive binder material, e.g., a ceramic material. The phosphor material 16 may be located on the surface of and thermally coupled to a reflector 32. The phosphor material 16 may be deposited as a layer thin enough to minimize the length of the thermal path from the phosphor material 16 to the reflector 32, while being sufficiently thick to convert, into fluorescent light 24, the majority of polarized excitation light 22 that enters the phosphor material 16. For example, the phosphor may be deposited as a 50 micrometer thick layer.

The reflector 32 may be made of silver, a dichroic coating, or a combination thereof. Efficient cooling may be provided in the back of the phosphor material 16 through the reflector 24. For example, the reflector 32 may be a metallic substrate with a high thermal conductivity treated with a highly reflective coating.

The light pipe system 11 is positioned such that, when the phosphor material 16 emits fluorescent light 24, the second surface 20 of the light pipe integrator 12 is positioned to receive a majority of the fluorescent light 24. For example, the light pipe integrator 12 may be positioned in close proximity to the phosphor material 16 so as to minimize the gap between the light pipe integrator 12 and the phosphor material 16. The gap may increase the area illuminated by the polarized excitation light 22 as well as reduce the amount of fluorescent light 24 received by the second surface 20 from the illuminated area of the phosphor material 16.

The tapered light pipe integrator 12 in FIG. 2 has the opposite effect on the fluorescent light 24 as the polarized excitation light 22. That is, the tapering of the tapered light pipe integrator 12 is chosen to reduce the wide emission angles of the fluorescent light 24 (e.g., to the acceptance angles of a light valve such as a DLP chip) while increasing the spotsize, thereby maintaining the étendue. Similar to the polarized excitation light 22, the fluorescent light 24 is mixed as it propagates through the tapered light pipe integrator 12 to uniformize the fluorescent light 24 exiting the first surface 18. The mixing of the fluorescent light 24 can eliminate the effect of non-uniformities in the phosphor layer or residual non-uniformities in the excitation light illumination spot. The tapered light pipe integrator 12 may also be configured to modify an aspect ratio of the fluorescent light 24 exiting the first surface 18 to match the aspect ratio of an imaging chip of a projector.

Figure 3:
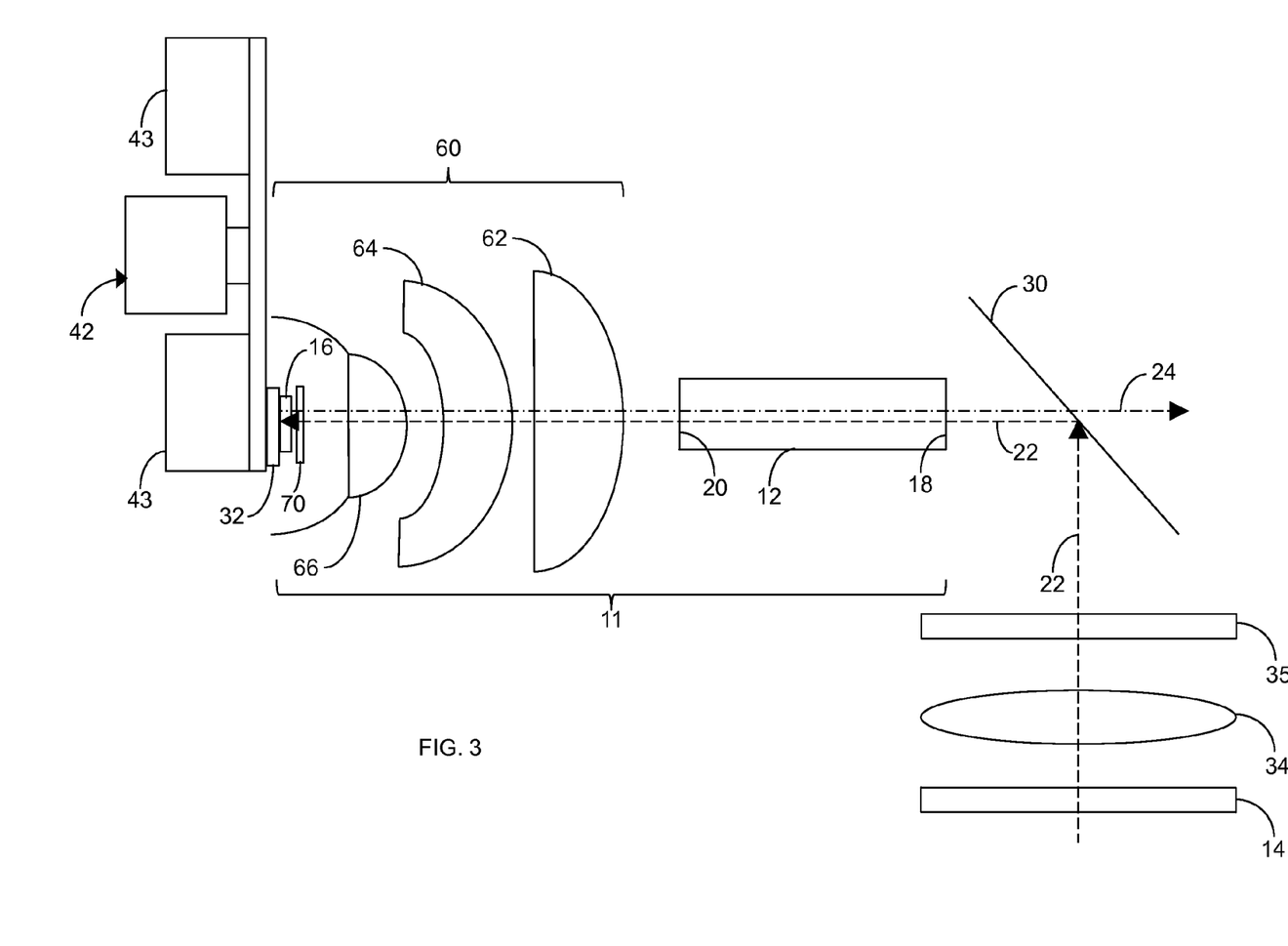
FIG. 3 is a schematic view of an alternative exemplary laser-phosphor light source.

Turning to FIG. 3, in an alternative embodiment, the light pipe integrator system 11 includes a straight light pipe integrator 12 and a lens system 60. The lens system 60 may be positioned between the light pipe integrator 12 and the phosphor material 16. The lens system 60 may include, e.g., any suitable combination of lenses configured to create an image of the phosphor material 16 onto the second surface 20 of the light pipe integrator 12. For example, the lens system 60 may include two lenses 62, 64 and create a magnified image of the phosphor material 16 onto the second surface 20. The magnification factor of the lens system being chosen to reduce the wide emission angles of the fluorescent light 24 (e.g., to the acceptance angles of a light valve such as a DLP chip) while increasing the spotsize.

Due to the wide emission angles of the phosphor material 16, spherical aberrations of the lens system 60 may result in a larger than desired image of the phosphor material 16 at the second surface 20. To reduce spherical aberrations and/or minimize the magnification factor of the lens system 60, the lens system 60 may additionally include a spherical reflector 66. The spherical reflector 66 may be positioned relative to the phosphor material 16 such that the spherical reflector 66 captures a majority of the fluorescent light 24 emitted by the phosphor material 16 in a direction that is not captured by the other one or more lenses 62, 64 of the lens system 60. The spherical reflector 66 may be configured to reflect the fluorescent light 24 back to the phosphor material 16. The reflected fluorescent light 24 may be scattered by the phosphor material 16 such that the scattered fluorescent light 24 is added to the fluorescent light 24 emitted by the phosphor material 16.

The reduced magnification factor of the lens system 60 due to the use of the spherical reflector 66 makes it possible to illuminate a larger area of the phosphor material 16 with the polarized excitation light 22. Because the energy of the polarized excitation light 22 is spread over a wider area of the phosphor material 16, it becomes easier to sufficiently cool the phosphor material 16 in order to maintain proper temperatures and avoid thermal quenching of the phosphor. Additionally, recycling of the wide emission angles of the fluorescent light 24 via the spherical reflector 66 effectively reduces the étendue of the fluorescent light 24 exiting the first surface 18 of the light pipe integrator 12.

Figure 5:
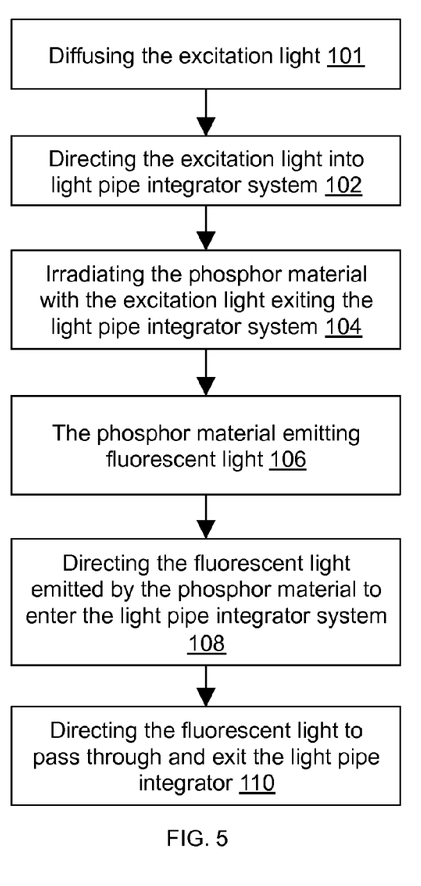
FIG. 5 is a block diagram illustrating a method for phosphor conversion of received polarized excitation light using a phosphor material.

Turning to FIG. 5, a block diagram depicting a method for phosphor conversion of received polarized excitation light using a phosphor material is shown. In process block 101, a diffuser 35 diffuses the excitation light. In process block 102, the excitation light is directed into the light pipe integrator system 11. The polarized excitation light 22 enters the first surface 18 of the light pipe integrator 12 and propagates by multiple reflections from the first surface 18 to the second surface 20. At the second surface 20, the excitation light exits the light pipe integrator 12 and the light pipe integrator system 11 images the polarized excitation light 22 onto the phosphor material 16.

In process block 104, the polarized excitation light 22 exiting the light pipe integrator system 11 irradiates the phosphor material 16 such that the phosphor material 16 emits fluorescent light 24 having a different spectrum than the spectrum of the polarized excitation light 22. In process block 106, the fluorescent light 24 emitted by the phosphor material 16 is directed to enter the light pipe integrator system 11 via the second surface 20 of the light pipe integrator 12. Finally, in process block 108, the fluorescent light 24 is directed to pass through the light pipe integrator 12 and exit the light pipe integrator 12 via the first surface 18.

One potential disadvantage of phosphor conversion of the polarized excitation light 22 is that the fluorescent light 24 emitted by the phosphor material 16 is not polarized. Polarized light is desired in applications such as LCD or LCOS based light valve projectors or polarized 3D projectors. Polarization recuperation optics may be used to polarize the fluorescent light 24, however this significantly reduces the maximum achievable brightness (i.e., polarization recuperation optics double the étendue of the light, compensation for which requires a two times smaller illuminated spot on the phosphor, resulting in the emission of less light).

When a polarized output is needed, a reflective polarizer 70 may be placed in close proximity to the phosphor layer. The reflective polarizer 70 may be positioned between the polarized excitation light source 14 and the phosphor material 16 with an orientation in alignment with the polarization direction of the polarized excitation light 22, such that the polarized excitation light 22 is transmitted through the reflective polarizer 70. The reflective polarizer 70 may transmit light exhibiting a same polarization as the polarized excitation light 22 and reflect light exhibiting an orthogonal polarization as the polarized excitation light 22. The fluorescent light 24 exhibiting a mix of the same polarization as the excitation light and the orthogonal polarization as the excitation light Approximately half of the fluorescent light 24 emitted by the phosphor material 16 has the same polarization as the polarized excitation light 24 and passes through the reflective polarizer 70. The other half of the fluorescent light 24 emitted by the phosphor material 16 has a polarization orthogonal to the polarized excitation light 24 and is reflected by the reflective polarizer 70. That is, approximately 50% of the fluorescent light 24 emitted by the phosphor material 16 will pass through the reflective polarizer 70 in a first pass, while the remainder of the fluorescent light 24 emitted by the phosphor material 16 will experience one or more reflections by the reflective polarizer 70 and the reflector 24.

Turning to FIGS. 6A-6D, polarization of the fluorescent light 24 emitted by the phosphor material 16 is depicted. In FIGS. 6A-6D, a gap is shown between the reflector 32 and the phosphor material 16. This gap is included in the figures to enable visualization of scattering and reflection of the fluorescent light 24 and should not be interpreted to imply that a gap is required between the reflector 32 and the phosphor material 16. While there may be a gap between the phosphor material 16 and the reflector 32, the phosphor material 16 may also be, e.g., mounted to the reflector 32 as depicted in FIG. 2.

Figure 6A:
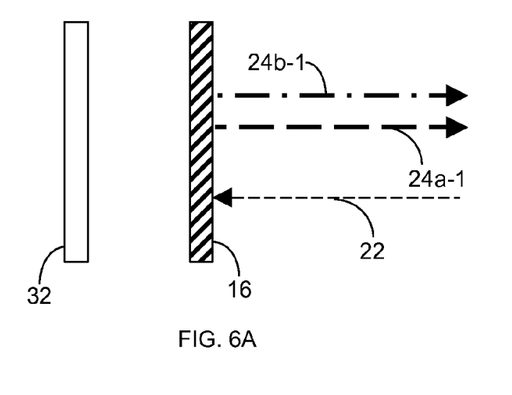
FIGS. 6A-D is a schematic view depicting polarization recuperation.
Figure 6B:
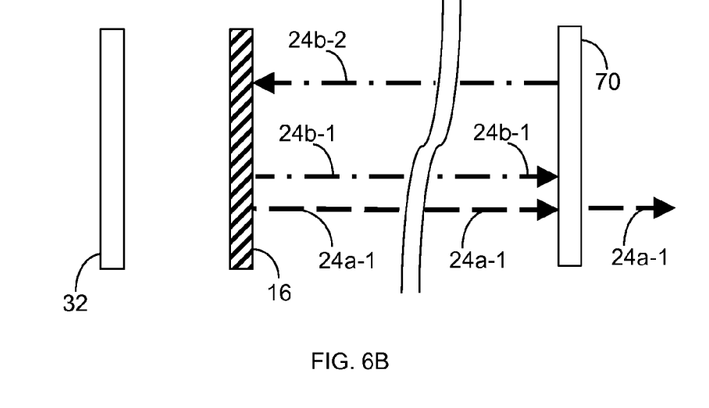
Figure 6C:
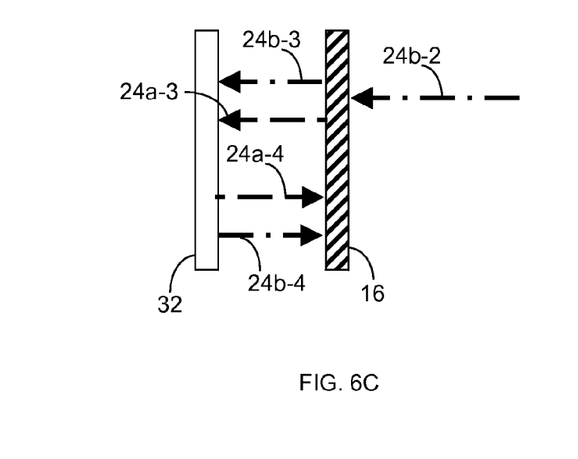

In FIG. 6A, the polarized excitation light 22 interacts with the phosphor material 16 and fluorescent light 24 is emitted having the same polarization as the polarized excitation light 24 ("same polarized fluorescent light 24a-1") and the orthogonal polarization as the polarized excitation light 24 ("opposite polarized fluorescent light 24b-1"). In FIGS. 6A-6C, the polarized excitation light 24 is represented by a thin dashed line, the same polarized fluorescent light 24a-1, 24a-2, 24a-3, 24a-4, 24a-5, 24a-6 is represented by a thick dashed line, and the opposite polarized fluorescent light 24b-1, 24b-2, 24b-3, 24b-4, 24b-5, 24b-6 is represented by a thick dashed and dotted line.

In FIG. 6B, the interaction, with the reflective polarizer 70, of the same polarized fluorescent light 24a-1 and the opposite polarized fluorescent light 24b-1 from FIG. 6A is shown. The reflective polarizer 70 reflects the opposite polarized fluorescent light 24b-1 (represented as 24b-2), while the same polarized fluorescent light 24a-1 passes through the reflective polarizer 70.

In FIG. 6C, the reflected opposite polarized fluorescent light 24b-2 is scattered by the phosphor material 16. The phosphor material 16 is configured to scatter fluorescent light 24 reflected by the reflective polarizer 70 such that the polarization exhibited by the scattered fluorescent light exhibits both the same polarization as the excitation light and the orthogonal polarization as the excitation light. That is, scattering by the phosphor material 16 is depolarizing, such that the reflected opposite polarized fluorescent light 24b-2 is scattered as both opposite polarized fluorescent light 24b-3 and same polarized fluorescent light 24a-3. The scattered opposite polarized fluorescent light 24b-3 is reflected by the reflector 32 (identified as 24b-4) and the scattered same polarized fluorescent light 24a-3 is reflected by the reflector 32 (identified as 24a-4).

Figure 6D:
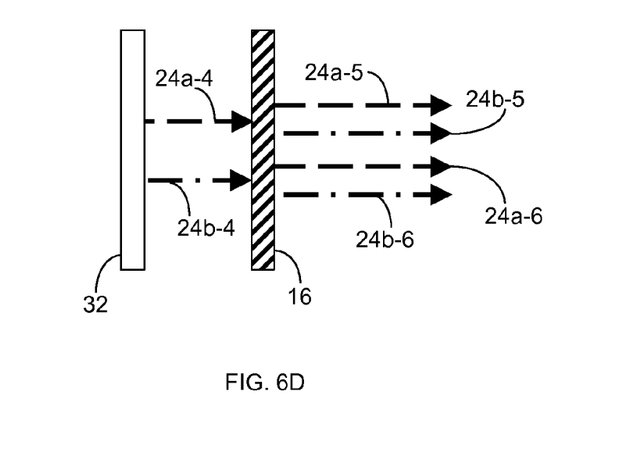

In FIG. 6D, both the reflected opposite polarized fluorescent light 24b-4 and the reflected same polarized fluorescent light 24a-4 are scattered by the phosphor material 16. The reflected same polarized fluorescent light 24a-4 is scattered as both opposite polarized fluorescent light 24b-5 and same polarized fluorescent light 24a-5. Similarly, the reflected opposite polarized fluorescent light 24b-4 is scattered as both opposite polarized fluorescent light 24b-6 and same polarized fluorescent light 24a-6.

Figure 7:
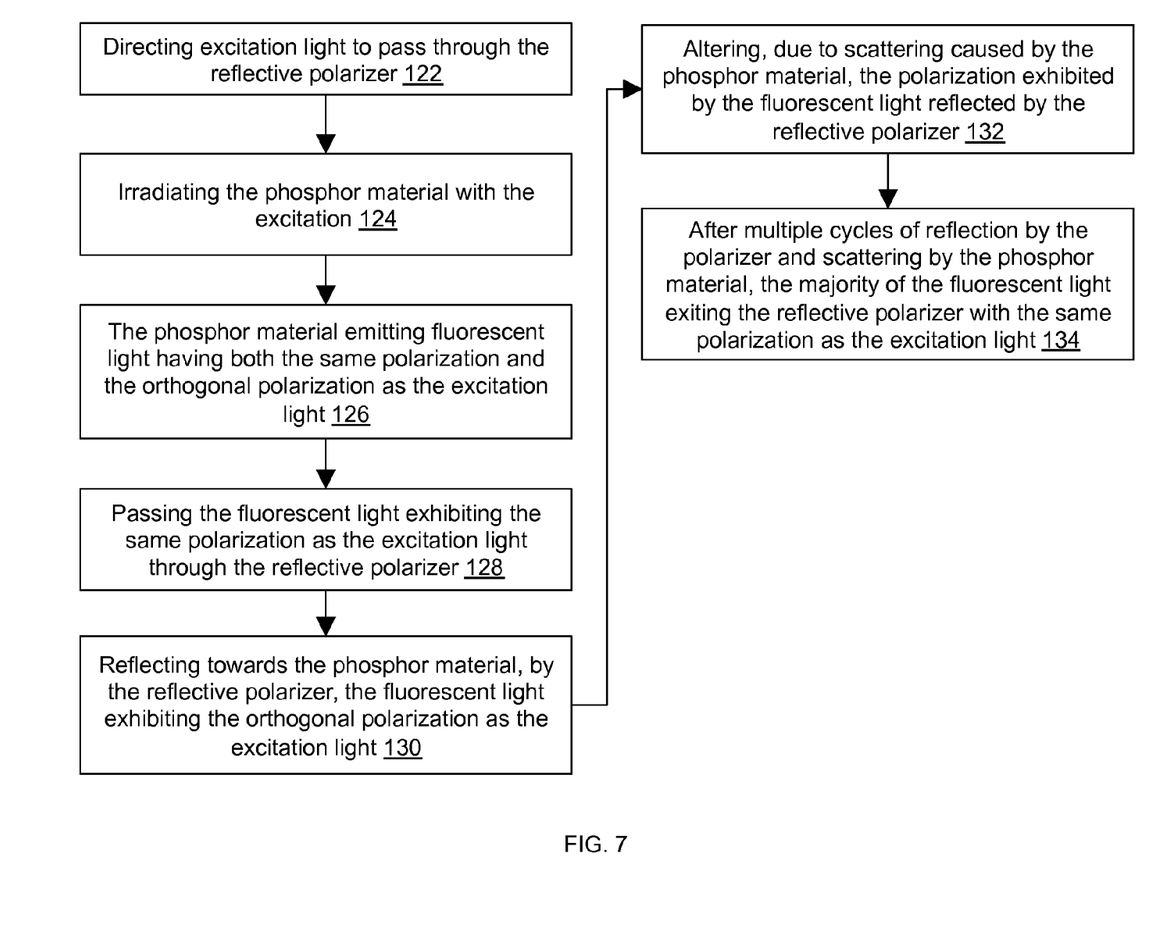
FIG. 7 is a block diagram illustrating a method for outputting polarized fluorescent light using phosphor conversion of received polarized excitation light.

Turning to FIG. 7, a block diagram depicting a method for outputting polarized fluorescent light using phosphor conversion of received polarized excitation light is shown. In process block 122, the polarized excitation light 22 is directed to pass through the reflective polarizer 70 prior to irradiating the phosphor material 16. In process block 124, the phosphor material 16 is irradiated with the polarized excitation light 22. In process block 126, the phosphor material 16 emits fluorescent light 24 having both the same polarization and the orthogonal polarization as the polarized excitation light 22.

In process block 128, the fluorescent light 24 exhibiting the same polarization as the polarized excitation light 22 is passed through the reflective polarizer 128. In process block 130, the fluorescent light 24 exhibiting the orthogonal polarization as the polarized excitation light 22 is reflected towards the phosphor material 16 by the reflective polarizer 70. In process block 132, the polarization exhibited by the fluorescent light 24 reflected by the reflective polarizer 70 is altered due to scattering caused by the phosphor material 16. Finally, in process block 134, after multiple cycles of reflection by the reflective polarizer 70 and scattering by the phosphor material 16, the majority of the fluorescent light exits the reflective polarizer 70 with the same polarization as the polarized excitation light 22.

As described above and as depicted in FIGS. 2 and 3, the reflective polarizer 70 may be positioned in close proximity to the phosphor material 16 in order to avoid the reflected fluorescent light 24 covering a wider area on the phosphor material 16 than the area illuminated by the polarized excitation light 22. For example, the reflective polarizer 70 may be optically bonded to the phosphor material 16. However, as depicted in FIG. 4, when a tapered light pipe integrator 12 is used, the light pipe integrator 12 may be positioned between the phosphor 16 and the reflective polarizer 70.

Figure 4:
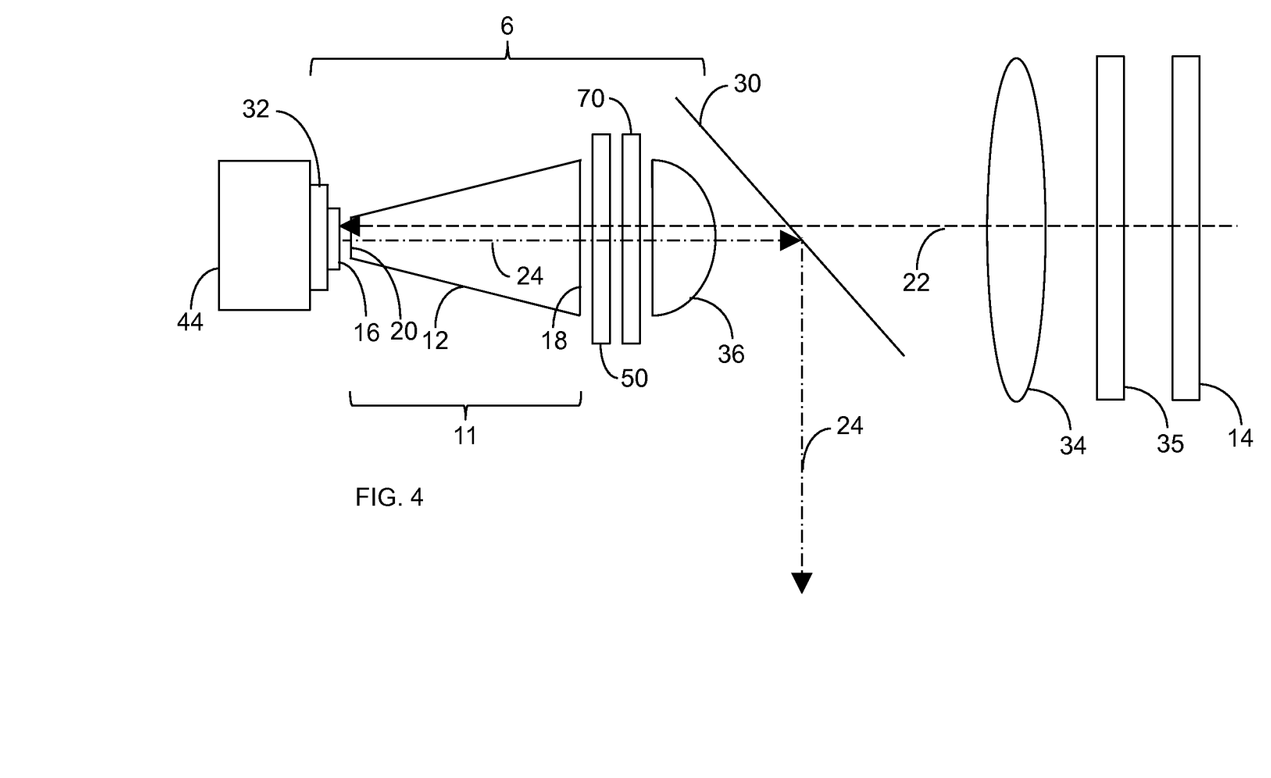
FIG. 4 is a schematic view of an alternative exemplary laser-phosphor light source including polarization recuperation.

With reference to FIG. 4, the reflective polarizer 70 is positioned in close proximity to the first surface 18 of the light pipe integrator 12, between the first surface 18 and the exit lens 36. For example, the reflective polarizer 70 may be optically bonded to the first surface 18 of the light pipe integrator 12.

The reflective polarizer may be, e.g., a wiregrid reflective polarizer with a high transmission for the desired polarization direction. In embodiments having a wiregrid reflective polarizer, the wiregrid reflective polarizer may be positioned with a wiregrid side facing the first surface 18 (i.e., the source of the fluorescent light 24). The other side of the wiregrid reflective polarizer may have an anti-reflective coating. A gap between the first surface 18 and the wiregrid polarizer may be as small as possible, while large enough to avoid frustrated total internal reflection (e.g., 10 micrometers).

With reference to FIG. 4, a quarter wave retarder 50 may be used to improve the recycling of polarized excitation light 22 that was not converted into fluorescent light 24. Approximately one half of the polarized excitation light 22 that was not converted into fluorescent light 24 after illuminating the phosphor material 16 may be reflected by the reflective polarizer 70 to again illuminate the phosphor material 16. However, a portion of the polarized excitation light 24 returning to the reflective polarizer 70 may be due to specular reflection of the polarized excitation light 24 at optical interfaces (e.g., the interface between the phosphor material 16 and air). Specular reflection of the polarized excitation light 24 will not affect the polarization of the polarized excitation light 22 and the specularly reflected polarized excitation light 24 will pass through the reflective polarizer 70 without illuminating the phosphor material 16 again. In order for this component to be reflected by the reflective polarizer 70 as well, the quarter wave retarder 50 may be used to rotate the polarization direction of the polarized excitation light 22 when the excitation light is reflected at the position of the phosphor material 16 by, e.g., positioning the quarter wave retarder 50 between the phosphor material 16 and the reflective polarizer 70.

The use of the reflective polarizer 70 in conjunction with the polarized excitation light 22 illuminated phosphor material 16 provides a number of distinct advantages over the use a reflective polarizer and LED emitted light. For example, separating the phosphor material 16 and the reflective polarizer 70 from the source 14 would not be efficient if light from an LED is used. That is, 50% of the light generated by an LED would not pass through the reflective polarizer, because it is unpolarized, while laser light is already polarized.

With further reference to FIG. 2, prior to interacting with the light pipe integrator system 11, the polarized excitation light 22 may be condensed by a condensing lens 34, diffused by a polarization maintaining diffuser 35, and reflected by a dichroic polarizing beam splitter 30. The diffuser 35 may diffuse the polarized excitation light 22 to break the collimation of the polarized excitation light 22. For example, the diffuser 35 may introduce diffusion angles of approximately one degree or smaller. The diffuser 35 may comprise, e.g., a micro-lens array or holographic diffuser positioned between the source 14 and the reflective polarizer 70. The diffuser may have a top-hat profile or a Gaussian profile. As depicted in FIG. 2, the diffuser may be positioned along the light path after the condensing lens 34. Alternatively, as depicted in FIG. 4, the diffuser may be positioned along the light path prior to the condensing lens 34.

The dichroic polarizing beam splitter 30 may be configured to reflect light having the spectrum of the polarized excitation light 22 and exhibiting one polarity, transmit light having the spectrum of the polarized excitation light 22 and exhibiting an orthogonal polarity, and transmit light having a spectrum in the spectrum of the fluorescent light 24. For example, the dichroic polarizing beam splitter 30 may reflect the polarized excitation light 22 such that it enters the first surface 18 of the light pipe integrator 12 and transmit the fluorescent light 24 exiting the second surface 20 of the light pipe integrator 12.

Alternatively, as depicted in FIG. 4, the dichroic polarizing beam splitter 30 may be configured to transmit light having the spectrum of the polarized excitation light 22 and exhibiting one polarity, reflect light having the spectrum of the polarized excitation light 22 and exhibiting an orthogonal polarity, and reflect light having a spectrum in the spectrum of the fluorescent light 24. For example, the dichroic polarizing beam splitter 30 may transmit the polarized excitation light 22 such that it enters the first surface 18 of the light pipe integrator 12 and reflect the fluorescent light 24 exiting the second surface 20 of the light pipe integrator 12.

Figure 8:
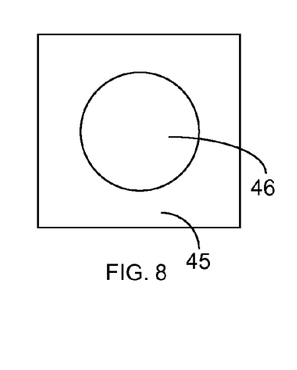
FIG. 8 is a schematic view of an exemplary first surface of the light pipe integrator.

With reference to FIG. 8, the first surface 18 may include a transmissive portion 46 and a reflective portion 45. A dichroic coating may cover the reflective portion 45 of the first surface 18. The dichroic coating may be configured to reflect light having a spectrum in the spectrum of the polarized excitation light 22 and pass light having a spectrum in the spectrum of the fluorescent light 24. The transmissive portion 46 may be configured to allow the polarized excitation light 22 to enter the first surface 18 of the light pipe integrator 12. Alternatively, an additional component may be added to the system 10 in close proximity to the first surface 18, a surface of the additional components including the transmissive portion 46 and the reflective portion 45.

The reflective portion 45, e.g., may enhance the efficiency of the system 10 if the polarized excitation light 22 does not cover an entirety of the first surface 18. The reflective portion 45 may recycle excitation light 24 returning from the phosphor material 16 that was not converted into fluorescent light 24. In this way, the reflective portion 45 may reflect the excitation light 24 and return it to the phosphor material 16 to be converted into fluorescent light 24.

With further reference to FIG. 2, the system 10 may include a spectrum shifting dichroic element 40 (e.g., a red shifting dichroic mirror used to red shift the spectrum of the fluorescent light 24). As depicted in FIG. 2, the spectrum shifting dichroic element 40 may be positioned in the light path between the polarized excitation light source 14 and the phosphor material 16. The spectrum shifting dichroic element 40 may be, e.g., a dichroic coating covering an entirety of the second surface 20 of the light pipe integrator 12 or a separate dichroic mirror as depicted in FIG. 2. The spectrum shifting dichroic element 40 may be configured to reflect the fluorescent light 24 having a wavelength range in, e.g., a lower half, a lower third, a lower quarter, a lower 10 percent, or any suitable percentage of the spectrum of the fluorescent light 24. The reflected fluorescent light 24 may be partially recycled to the phosphor material 16, where the phosphor material 16 may partially absorb the higher energy shorter wavelengths and emit fluorescent light 24 having longer wavelengths that will be transmitted by the spectrum shifting dichroic element 40. The short wavelength fluorescent light may travel multiple cycles between the spectrum shifting dichroic element 40 and the phosphor material 16. The final compound output of fluorescent light may show a central wavelength that is longer than the central wavelength of the original fluorescent light, while the final output energy in the desired longer wavelength range may be higher than the energy from the original fluorescent light travelling through the spectrum shifting dichroic element 40 in a first pass.

Figure 9:
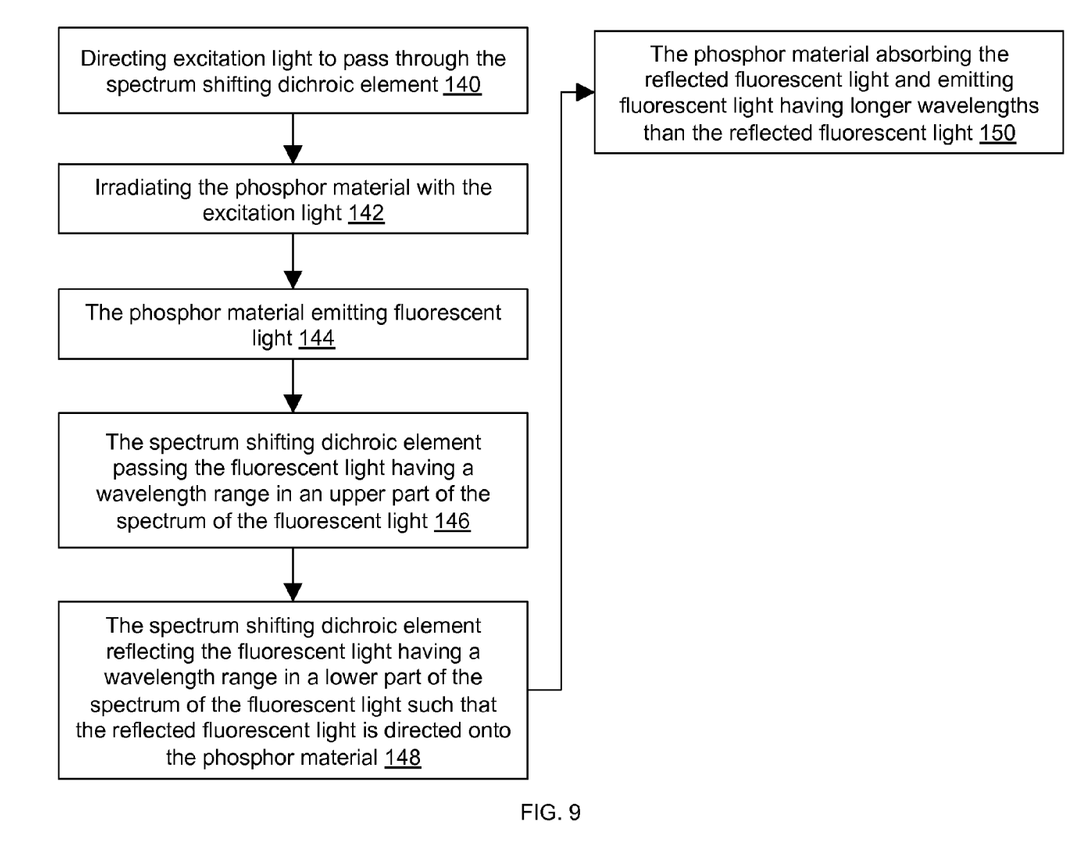
FIG. 9 is a block diagram illustrating a method for outputting spectrum shifted fluorescent light using phosphor conversion of received polarized excitation light.

Turning to FIG. 9, a block diagram depicting a method for outputting spectrum shifted fluorescent light using phosphor conversion of received excitation light is shown. In process block 140, the polarized excitation light 22 is directed to pass through the spectrum shifting dichroic element 40 prior to irradiating the phosphor material 16. In process block 142, the phosphor material 16 is irradiated with the polarized excitation light 22. In process block 144, the phosphor material 16 emits fluorescent light 24.

In process block 146, the spectrum shifting dichroic element 40 passes the fluorescent light having a wavelength range in an upper part of the spectrum of the fluorescent light. In process block 148, the spectrum shifting dichroic element 40 reflects the fluorescent light having a wavelength range in a lower part of the spectrum of the fluorescent light such that the reflected fluorescent light is directed onto the phosphor material 16. In process block 152, the phosphor material 16 absorbs the reflected fluorescent light and emits fluorescent light having longer wavelengths than the reflected fluorescent light.

Turning to FIGS. 2 and 4, the reflector 32 may be thermally coupled to a heat sink 42, 44. The heat sink may comprise any suitable structure capable of removing heat from the phosphor. For example, the reflector 32 may be located on and thermally coupled to a rotating wheel 42 with cooling blades 43 on the back of the rotating wheel 42, the high speed rotation of the wheel providing air cooling. In another example liquid cooling can be applied using a liquid heat exchanger 44.

The light pipe integrator system 11 may additionally include an exit lens 36. The exit lens 36 may be positioned adjacent the first surface 18 of the tapered light pipe integrator 12. The exit lens 36 may be configured to transform the fluorescent light 24 exiting the first surface 18 to telecentric bundles.

To provide a telecentric illumination from the light pipe integrator 12, the focal length of the exit lens 36 may be chosen to be:

$$f=L*(1+Hi/Ho),$$

where f is the focal length, L is the length of the integrator, and Hi/Ho is the ratio between the height of the integrator at the input surface 18 (Hi) versus the height at the output surface 20 (Ho).

The system 10 may illuminate for example an HD DLP chip with a 0.65 inch diagonal and micro-mirrors having a tilt angle of +/−12 degrees. An active area of the chip may be 14.1 mm×8.1 mm. The magnification of the illumination optics between the chip and the first surface 18 of the tapered integrator rod 12 may be chosen to be a factor of 2. Therefore, the size of the first surface 18 of the light pipe integrator 12 may be 7.05 mm×4.05 mm. The light bundles exiting the first surface 18 may be telecentric with an angle of +/−24 degrees. Assuming fluorescent light 24 having emission angles of +/−84 degrees, the spot size of the illuminated area on the phosphor material 16 may be 3.5 times smaller in each direction (e.g., 2×1.15 mm). Hence Hi/Ho is 3.5. Therefore if the length of the light pipe integrator 12 is 50 mm, the focal length of the exit lens 36 may be 225 mm.

What is claimed is:

1. A phosphor converter receiving excitation light emitted by a source of polarized excitation light, the phosphor converter comprising:
   a phosphor material located on the surface of a reflector and a light pipe integrator system,
   the phosphor material, when irradiated by the excitation light, emitting fluorescent light having a different spectrum than a spectrum of the excitation light;
   a light pipe integrator system comprising a light pipe integrator; the light pipe integrator having a first surface through which the excitation light enters the light pipe integrator and a second surface through which the excitation light exits the light pipe integrator;
   the light pipe integrator system positioned relative to the source and the phosphor material such that:
      when the source outputs excitation light, the first surface of the light pipe integrator receives the excitation light; and
      when excitation light exits the second surface of the light pipe integrator, the excitation light is imaged onto the phosphor material;
   the light pipe system positioned such that, when the phosphor material emits fluorescent light, the second surface of the light pipe integrator is positioned to receives a majority of the fluorescent light and the fluorescent light is transmitted to the first surface of the light pipe integrator;
   a reflective polarizer positioned in the light path between the polarized excitation light source and the phosphor material, wherein:
      the reflective polarizer transmits light exhibiting a same polarization as the excitation light;
      the reflective polarizer reflects light exhibiting an orthogonal polarization as the excitation light such that the reflected light is incident on the phosphor material; and
      the fluorescent light exhibits a mix of the same polarization as the excitation light and the orthogonal polarization as the excitation light; and
   the phosphor material configured to scatter fluorescent light reflected by the reflective polarizer such that the polarization exhibited by the scattered fluorescent light exhibits both the same polarization as the excitation light and the orthogonal polarization as the excitation light.

2. The phosphor converter of claim 1, wherein a mild diffuser is positioned such that the excitation light is diffused by the diffuser prior to being received by the phosphor converter.

3. The phosphor converter of claim 1, wherein the light pipe integrator system comprises a tapered light pipe integrator.

4. The phosphor converter of claim 3, the light pipe integrator system further comprising an exit lens, wherein the exit lens is positioned adjacent the first surface of the tapered light pipe integrator, and the exit lens is configured to transform light bundles exiting the first surface of the tapered light pipe integrator to be telecentric.

5. The phosphor converter of claim 1, wherein:
   the light pipe integrator system further comprises a lens system;
   the lens system positioned between the light pipe integrator and the phosphor material; and
   the lens system comprises lenses, the lenses configured to create an image of the illuminated part of the phosphor material onto the second surface of the light pipe integrator.

6. The phosphor converter of claim 5, the lens system further comprising a spherical reflector, wherein the spherical reflector is positioned relative to the phosphor material such that, when the phosphor material emits fluorescent light, the spherical reflector captures a part of the fluorescent light emitted by the phosphor material in a direction that is not captured by the lenses of the lens system and/or a part of the excitation light that is diffusively reflected by the phosphor material, and reflects that light back to the phosphor material, the phosphor material configured to scatter fluorescent light reflected by the spherical reflector such that the light is added to the emitted fluorescent light in random directions and/or to absorb part of the excitation light reflected back by the spherical reflector and emit additional fluorescent light in random directions.

7. The phosphor converter of claim 1, wherein the reflective polarizer is located in close proximity to the phosphor material.

8. The phosphor converter of claim 1, wherein the second surface of the light pipe integrator is positioned in close proximity to the phosphor material and the reflective polarizer is positioned in close proximity to first surface of the light pipe integrator.

9. The phosphor converter of claim 1, further comprising a heat sink, wherein the phosphor material is thermally coupled to the heat sink.

10. The phosphor converter of claim 8, wherein the heat sink comprises a liquid heat exchanger.

11. The phosphor converter of claim 1, wherein the source comprises a laser diode or an array of laser diodes.

12. The phosphor converter of claim 1, wherein:
the first surface of the light pipe integrator comprises a transmissive portion and a reflective portion for a defined range of wavelengths, including the wavelengths of the incident excitation light;
a dichroic coating covers the reflective portion of the first surface, the dichroic coating configured to reflect light having a spectrum in the spectrum of the excitation light and pass light having a spectrum in the spectrum of the fluorescent light emitted by the phosphor material; and
the transmissive portion of the first surface configured to allow the excitation light to enter the light pipe integrator.

13. The phosphor converter of claim 1, wherein a spectrum shifting dichroic element is positioned in the light path between the polarized excitation light source and the phosphor material, the spectrum shifting dichroic element configured to reflect the fluorescent light having a wavelength range in a lower part of the spectrum of the fluorescent light such that the reflected fluorescent light is directed onto the phosphor material, wherein the phosphor material absorbs the reflected fluorescent light and emits fluorescent light having longer wavelengths than the reflected fluorescent light.

14. The phosphor converter of claim 1, wherein the spectrum of the excitation light is between 400 nm and 495 nm and the spectrum of the fluorescent light is between 495 nm and 700 nm.

15. The phosphor converter of claim 1, wherein the phosphor material is a layer having a thickness of approximately 50 micrometers.

16. The phosphor converter of claim 1, wherein the length of the light pipe integrator is at least 50 mm.

17. The phosphor converter of claim 1, wherein a dichroic polarizing beam splitter is positioned such that, when the source emits excitation light, the excitation light is reflected by the dichroic polarizing beam splitter such that the excitation light enters the first surface of the light pipe integrator system, wherein the dichroic polarizing beam splitter is configured to reflect light having a spectrum of the excitation light and exhibiting one polarity, transmit light having the spectrum of the excitation light and exhibiting an orthogonal polarity, and transmit light having a spectrum in the spectrum of the fluorescent light emitted by the phosphor material.

18. The phosphor converter of claim 1, further comprising a quarter wave retarder to rotate the polarization direction of the excitation light when the excitation light is reflected at the position of the phosphor material.

19. The phosphor converter of claim 1, wherein a dichroic polarizing beam splitter is positioned such that, when the source emits excitation light, the excitation light is transmitted by the dichroic polarizing beam splitter such that the excitation light enters the first surface of the light pipe integrator system, wherein the dichroic polarizing beam splitter is configured to transmit light having a spectrum of the excitation light and exhibiting one polarity, reflect light having the spectrum of the excitation light and exhibiting an orthogonal polarity, and reflect light having a spectrum in the spectrum of the fluorescent light emitted by the phosphor material.

20. A laser-phosphor light source, the light source comprising:
a source of polarized excitation light;
a phosphor converter receiving the excitation light;
the phosphor converter comprising:
a phosphor material located on the surface of a reflector;
the phosphor material, when irradiated by the excitation light, emitting fluorescent light having a different spectrum than a spectrum of the excitation light;
a reflective polarizer positioned in the light path between the polarized excitation light source and the phosphor material, wherein:
the reflective polarizer transmits light exhibiting a same polarization as the excitation light;
the reflective polarizer reflects light exhibiting an orthogonal polarization as the excitation light, such that the reflected light is incident on the phosphor material; and
the fluorescent light exhibiting a mix of the same polarization as the excitation light and the orthogonal polarization as the excitation light; and
the phosphor material configured to scatter fluorescent light reflected by the reflective polarizer such that the polarization exhibited by the scattered fluorescent light exhibits both the same polarization as the excitation light and the orthogonal polarization as the excitation light.

21. The laser-phosphor light source of claim 20, wherein a spectrum shifting dichroic element positioned in the light path between the excitation light source and the phosphor material, the spectrum shifting dichroic element configured to reflect the fluorescent light having a wavelength range in a lower part of the spectrum of the fluorescent light such that the reflected fluorescent light is directed onto the phosphor material, wherein the phosphor material absorbs the reflected fluorescent light and emits fluorescent light having longer wavelengths than the reflected fluorescent light.

22. A spectrum-shifted phosphor light source comprising:
a source of excitation light;
a phosphor converter receiving the excitation light;
the phosphor converter comprising:
a phosphor material located on the surface of a reflector,
the phosphor material, when irradiated by the excitation light, emitting fluorescent light having a different spectrum than a spectrum of the excitation light;
a spectrum shifting dichroic element positioned in the light path between the excitation light source and the phosphor material, the spectrum shifting dichroic element configured to reflect the fluorescent light having a wavelength range in a lower part of the spectrum of the fluorescent light such that the reflected fluorescent light is directed onto the phosphor material, wherein the phosphor material absorbs the reflected fluorescent light and emits fluorescent light having longer wavelengths than the reflected fluorescent light.

* * * * *